United States Patent [19]
Michael et al.

[11] Patent Number: 5,348,773
[45] Date of Patent: Sep. 20, 1994

[54] THRESHOLD SWITCHING DEVICE

[75] Inventors: Keith W. Michael; Udo C. Pernisz, both of Midland, Mich.

[73] Assignee: Dow Corning Corporation, Midland, Mich.

[21] Appl. No.: 82,112

[22] Filed: Jun. 28, 1993

Related U.S. Application Data

[62] Division of Ser. No. 694,721, May 2, 1991, Pat. No. 5,312,684.

[51] Int. Cl.$^5$ .................. B05D 3/06; B05D 5/12; B05D 3/02
[52] U.S. Cl. .................. 427/540; 427/126.2; 427/126.3; 427/126.5; 427/226
[58] Field of Search ............. 427/540, 101, 102, 79, 427/80, 126.2, 126.3, 126.4, 126.5, 126.6, 125, 226, 532

[56] References Cited

U.S. PATENT DOCUMENTS

| | | |
|---|---|---|
| 3,271,591 | 9/1966 | Ovshinsky . |
| 3,899,558 | 8/1975 | Fleming et al. . |
| 4,753,855 | 6/1988 | Haluska et al. . |
| 4,756,977 | 7/1988 | Haluska et al. . |
| 4,849,296 | 7/1989 | Haluska et al. ............ 427/58 |
| 4,973,526 | 11/1990 | Haluska ..................... 427/58 |
| 5,219,611 | 6/1993 | Giannelis et al. ........... 427/79 |
| 5,246,738 | 9/1993 | Blum ..................... 427/126.5 |
| 5,260,094 | 11/1993 | Giannelis et al. ........... 427/79 |

OTHER PUBLICATIONS

Ansari et al., J. Phys. D:Appl. Phys. 20(1987) pp. 1063–1066. no month.
Ramesham et al., NASA Tech Briefs, Dec. 1989, p. 28.
Morgan et al., Thin Solid Films, 15(1973), pp. 123–131. no month.
Simmons, Handbook of Thin Film Technology, Chapter 20 (1970). no month.
Japanese Abstract of JP55146959, Published Nov. 1980 Abstract Pub. date Feb. 1981, vol. 005019, group E044.
Al-Lsmail et al., J. Mat. Sci. 20 no month (1985) pp. 2186–2192.
Morgan et al., Thin Solid Films, 20(1974) pp. 57–59. no month.
Boelle et al., Applied Surface Science, 46(1990) pp. 200–205. no month.
Klein, J. Applied Phys., 40(1969) pp. 2728–2740. Jun.
Rakhshani et al., Int. J. Electronics., no month 1978, vol. 44, No. 6, 593–602.
Bullot et al., Phys. Stat. Sol(a) 71, K1 (1982). no month.

Primary Examiner—Marianne Padgett
Attorney, Agent, or Firm—Roger E. Gobrogge

[57] ABSTRACT

This invention relates to a method of forming a threshold switching device which exhibits negative differential resistance and to the devices formed thereby. The method comprises depositing a silicon dioxide film derived from hydrogen silsesquioxane resin between at least two electrodes and then applying a voltage above a threshold voltage across the electrodes.

19 Claims, 4 Drawing Sheets

THRESHOLD SWITCHING DEVICE

This is a divisional of copending application(s) Ser. No. 07/694,721 filed on May 2, 1991, now U.S. Pat. No. 5,312,684 issued May 17, 1994.

BACKGROUND OF THE INVENTION

This invention relates to a method of forming threshold switching devices which exhibit negative differential resistance and to the devices formed thereby. The method comprises depositing a silicon dioxide film derived from hydrogen silsesquioxane resin between at least two electrodes and applying a voltage above a threshold voltage across the electrodes.

Numerous devices which exhibit threshold switching are known in the art. For example, Ovshinsky in U.S. Pat. No. 3,271,591 describes such devices in which semiconductor materials, such as crystalline or amorphous tellurides, selenides, sulfides or oxides of substantially any metal, are deposited between electrodes. The semiconductors and methods specifically set forth in this reference, however, are not the same as those claimed herein. As such, the j-V curves in this reference differ from those of the present application.

Threshold switching with negative differential resistance is also known in various metal oxide thin films. For instance, Bullot et al., Phys. Star. Sol. (a) 71, K1 (1982), describe threshold switching in vanadium oxide layers deposited from gels; Ansari et al., J. Phys. D:Appl. Phys. 20 (1987) 1063–1066 describe threshold switching in titanium oxide films formed by thermally oxidizing a titanium metal layer; Ramesham et al., NASA Tech Briefs, December 1989, p. 28, describe the switching in manganese oxide films; and Morgan et al., Thin Solid Films, 15 (1973) 123–131, describe switching and negative differential resistance in aluminum oxide films. The materials and characteristics described in these references, however, differ from those described herein.

The switching and negative differential resistance characteristics of silicon oxide films have likewise been described. For instance, Simmons, Handbook of Thin Film Technology, Chapter 14 (1970), describes electronic conduction through thin insulating films, including silicon oxide, as well as their negative resistance and memory characteristics; Al-Ismail et al., J. Mat. Sci. 20 (1985) 2186–2192, describe switching and negative resistance in a copper-silicon oxide-copper system; Morgan et al., Thin Solid Films, 20 (1974) S7–S9, describe threshold switching and memory in silicon oxide films; Boelle et al., Applied Surface Science 46 (1990) 200–205, describe the current-voltage characteristics of silica films derived from sol-gel low temperature methods; and Klein, J. Appl. Phys., 40 (1969) 2728–2740, describe the electrical breakdown of silicon oxide films. As with the prior metal oxide references, however, these too do not describe the methods and characteristics described herein.

Thin film silica coatings derived from hydrogen silsesquioxane resin are also known in the art. For instance, Haluska et al. in U.S. Pat. No. 4,756,977 describe forming such films by diluting hydrogen silsesquioxane resin in a solvent, applying the solution to a substrate, drying the solvent, and heating. Such coatings are taught therein to provide protection and electrical insulation.

The present inventors have now found that switching devices with desirable features can be formed by depositing a thin, hydrogen silsesquioxane derived silicon dioxide film between at least 2 electrodes and applying a voltage above a threshold voltage across the electrodes.

SUMMARY OF THE INVENTION

The present invention relates to a method of forming a threshold switching device having negative differential resistance. The method comprises depositing a non-dense silicon dioxide film derived from hydrogen silsesquioxane resin between at least two electrodes. A voltage above a certain threshold voltage is then applied across the electrodes to complete formation of the device.

The device formed in this manner is characterized in that 1) the conductive state of the thin film can be converted to the resistive state with memory by decreasing the applied voltage from a sufficiently high value to a value below the threshold voltage at a sufficiently high rate, 2) it can be converted from a resistive state to a conductive state with memory by the application of a threshold voltage and 3) the application of voltage above a threshold voltage results in the film exhibiting stable negative differential resistance.

DETAILED DESCRIPTION OF THE INVENTION

The present invention is based on the discovery that thin films of silicon dioxide derived from hydrogen silsesquioxane resin (thin films) exhibit novel threshold switching and negative differential resistance. This was particularly unexpected since the thin films herein are conventionally used as electrical insulation materials.

These novel devices show features beyond those taught in the prior art. For instance:

1. The devices can carry high current density (e.g., 1 Amp/cm$^2$);
2. The devices have been shown to operate with thick films (e.g., 1 micrometers) whereas the prior art teaches that the effect does not occur in films greater than 0.5 micrometers thick; and 3. The whole jV curve, especially the negative differential resistance region, has been shown to be stable and monotonic.

As used in this disclosure, the expressions "hydrogen silsesquioxane resin" or "H-resin" are meant to include those hydridosilane resins which are fully condensed [(HSiO$_{3/2}$)$_n$] as well as those which are only partially hydrolyzed and/or partially condensed and, thereby, may contain residual SiOR and/or SiOH substituents (wherein OR is a hydrolyzable group); and the expression "thin film" is used to describe the silicon dioxide films derived from hydrogen silsesquioxane.

Figure 1:
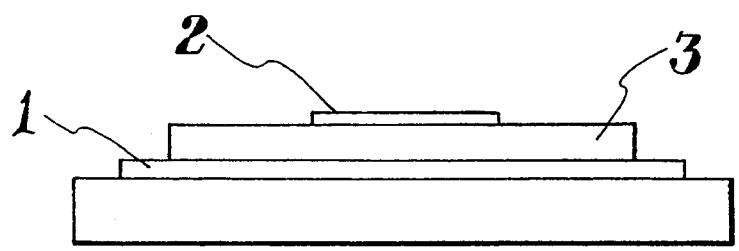
FIG. 1 is a cross-sectional view of a sandwich device of this invention.

The invention will be described with specific reference to the figures. FIG. 1 is a cross-sectional view of a representative device of this invention wherein electrodes (1) and (2) are separated by the thin film (3). Although this Figure exemplifies a sandwich electrode configuration, such an arrangement is not critical and nearly any configuration appropriate for a given device application may be used. For example, arrangements such as coplanar, transplanar, crossed grid arrays, two dimensional circular dot pattern, etc. may be used.

The shape of the electrodes and the materials from which they are constructed may be any conventionally known in the art. For instance, the electrodes can be made of nearly any electrically conductive or semiconductive material such as gold, silver, aluminum, platinum, copper, gallium arsenide, chromium, silicon, etc. Likewise, the electrodes can be used in nearly any shape or form desired, such as a wire or a conventional lead, provided they have at least enough device area to enable the desired current flow. Particularly preferred herein is the use of gold electrodes.

Contact between the electrodes and the thin film can be established by techniques well known in the art. For instance, the electrodes may be formed on the thin film by evaporating or sputtering the appropriate electrode material in vacuum. Alternatively, the thin film may be deposited directly onto preformed electrodes to create the appropriate contact or the preformed electrodes may be adhered to the thin film by conventional techniques.

The thin films (3) of this invention comprise silicon dioxide derived from hydrogen silsesquioxane resin. Generally, these films may be of any thickness desired. Those in the range of between about 50 and 5,000 nanometers are, however, preferred with those in the range of between about 100 and 600 nanometers being especially preferred.

Such thin films may be formed by any appropriate method. A particularly preferred technique comprises coating a substrate with a solution comprising a solvent and hydrogen silsesquioxane resin, evaporating the solvent to form a preceramic coating and then converting the preceramic coating to the thin film. Other equivalent methods, however, are also contemplated herein.

As defined above, the hydrogen silsesquioxane resins which may be used in this invention are those with the structure (HSiO$_{3/2}$)$_n$. Such resins are generally produced by the hydrolysis and condensation of silanes of the formula HSiX$_3$, wherein X is a hydrolyzable group, and they may be either fully hydrolyzed and condensed (HSiO$_{3/2}$)$_n$ or their hydrolysis or condensation may be interrupted at an intermediate point such that partial hydrolyzates (which contain Si-OR groups wherein OR is a hydrolyzable group) and/or partial condensates (which contain SiOH groups) are formed. Though not represented by this structure, these resins may contain a small percentage of silicon atoms which have either no hydrogen atoms or more than one hydrogen atom attached thereto due to various factors involved in their formation or handling.

Various methods for the production of these resins have been developed. For instance, Collins et al. in U.S. Pat. No. 3,615,272, which is incorporated herein by reference, describe a process of forming nearly fully condensed H-resin (which may contain up to 100-300 ppm silanol) comprising hydrolyzing trichlorosilane in a benzenesulfonic acid hydrate hydrolysis medium and then washing the resultant resin with water or aqueous sulfuric acid. The resultant polymeric material has units of the formula (HSiO$_{3/2}$)$_n$ in which n is generally 8-1000 and has a number average molecular weight of from about 800-2900 and a weight average molecular weight of between about 8000-28,000.

Similarly, Bank et al. in U.S. Pat. No. 5,010,159 hereby incorporated by reference, teach methods of forming such resins (which may contain up to 1000 ppm silanol) comprising hydrolyzing hydridosilanes in an arylsulfonic acid hydrate hydrolysis medium to form a resin which is then contacted with a neutralizing agent. A preferred embodiment of this latter process uses an acid to silane ratio of about 6/1.

Other methods, such as those described by Frye et al. in U.S. Pat. No. 4,999,397, hereby incorporated by reference, comprising hydrolyzing trichlorosilane in a non-sulfur containing polar organic solvent by the addition of water or HCl and a metal oxide or a method which comprises hydrolyzing a hydrocarbonoxy hydridosilane with water in an acidified oxygen-containing polar organic solvent, also produce such hydridosiloxane resins and are functional herein.

The H-resin is then deposited on the surface of the substrate. This can be accomplished in any manner, but a preferred method involves dissolving the H-resin in a solvent to form a solution and then applying this solution to the surface of the substrate. Various facilitating measures such as stirring and/or heating may be used to aid in the dissolution. Solvents which may be used include any agent or mixture of agents which will dissolve the H-resin to form a homogenous solution without affecting the thin film or its switching properties. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve the above materials to low solids. Generally, enough of the above solvent is used to form a 0.1-50 weight percent solution.

Besides H-resin, the coating solution may also include a modifying ceramic oxide precursor such that the resultant ceramic coating comprises a mixed silicon/metal oxide. Such precursors can include, for example, compounds of various metals, such as iron, aluminum, titanium, zirconium, tantalum, niobium and/or vanadium. These compounds generally form either solutions or dispersion when mixed with the H-resin and must be capable of being subsequently pyrolyzed at relatively low temperatures and relatively rapid reaction rates to form modifying ceramic oxide coatings. When such a modifying ceramic oxide precursor is used, it is generally present in the preceramic mixture in an amount such that the final coating contains 0.1 to 30 percent by weight modifying ceramic oxide.

Examples of modifying ceramic oxide precursors include tetra n-propoxy zirconium, tetraisobutoxy titanium, aluminum trispentanedionate, pentaethoxy tantalum, tripropoxy vanadium, pentaethoxy niobium, zirconium pentanedionate, and titanium dibutoxy bispentanedionate.

If modifying ceramic oxide precursors are to be included in the H-resin preceramic solution, they may be simply dissolved in the solution comprising the H-resin and the solvent and allowed to stand at room temperature for a time sufficient to allow the modifying ceramic oxide precursor to react into the structure of the H-resin. Generally, a period of greater than about 2 hours is necessary for said reaction to occur. The solution may then be applied to the substrate as discussed infra. Alternatively, the modifying ceramic oxide precursor may be hydrolyzed or partially hydrolyzed, dissolved in the solution comprising the solvent and H-resin and then immediately applied to the substrate. Various facilitating measures such as stirring or agitation may be used as necessary to produce said solutions.

A platinum, rhodium or copper catalyst may also be used herein to increase the rate and extent of hydrogen silsesquioxane resin conversion to silicon dioxide. Generally, any platinum, rhodium or copper compound or complex which can be solubilized will be functional. For instance, an composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of H-resin.

If the above solution method is used, the coating solution is applied by techniques such as spin coating, dip coating, spray coating or flow coating and the solvent allowed to evaporate. Any suitable means of evaporation may be used such as simple air drying by exposure to an ambient environment or by the application of a vacuum or mild heat.

The resultant preceramic coating is then converted to the silicon dioxide thin film. Generally, this is done at a temperature and in an environment which will not result in the formation of a fully dense film (2.2 g/cc). For instance, such silicon dioxide films may be formed by heating the preceramic coating in air at a temperature of from about 100 to about 600° C. For other environments (e.g. ammonia, oxygen, nitrogen, etc.), however, the temperature may vary.

It is generally important that the resultant thin film is not completely dense so that the observed behavior can occur. The exact density, however, is not critical and can vary over a wide range. Generally, the density is in the range of between about 40 and 95%, with densities in the range of between about 60 and 90% being preferred.

After the thin film is formed, the necessary electrodes are attached in the manner described above such that a voltage can be applied across the thin film.

A newly created device prepared in this manner initially exhibits an undefined, non-specific resistance. For instance, some devices may exhibit resistance values as low as 1 ohm while others exhibit values above 10 megohm. Those with very low resistance often have shorts between the electrodes due to pin holes and other device flaws. If present, such shorts should be "blown out" by applying a voltage sufficiently high to vaporize the electrode around the short (e.g., 10–20V from a low impedance voltage source).

Voltage is then slowly applied across the film of the device and increased until the threshold voltage is reached, at which point the resistance of the device suddenly falls. Upon such a voltage application, the device is completely formed and it remains in its low resistance state.

To obtain lower threshold voltages and more reproducible results, the devices of the invention may be placed in a nonoxidizing environment. Examples of suitable environments include nitrogen, argon, helium, carbon dioxide and the like. Alternatively, however, establishing a vacuum or encapsulating the device can also provide the desired environment.

The following discussion describes the characteristics of a typical device formed in the above manner and the procedures to switch the device from its ON state to an OFF state and back again. The typical device consists of a silica thin film with a thickness of about 200 nanometers and device area of about 0.1 cm$^2$. A voltage (measured in volt (V)) is applied across the electrodes and the current through the device as well as the voltage across the device are both measured. The current, measured in ampere (A) is converted to a current density and given in ampere/cm$^2$. The results are plotted in a diagram of current vs. voltage and referred to as a jV curve. The following values are only representative of the above device and are not meant to be limiting.

Threshold switching, as displayed by this device, is similar to that known in the art for other thin films. As voltage less than the threshold voltage (about 3 volts) is applied to an electrode thereon, the thin film exhibits a high impedance as would normally be associated with an insulator. The resistivity of the device in this "OFF" state is generally in the range of between about $10^8$ ohm cm and about $10^{11}$ ohm cm. When the applied voltage is raised above this threshold voltage, however, the thin film is rapidly converted to a state of low resistivity and the device supports a high current density. The resistivity in this "ON" state is typically in the range of between about 104 ohm cm and about 107 ohm cm.

Figure 2:
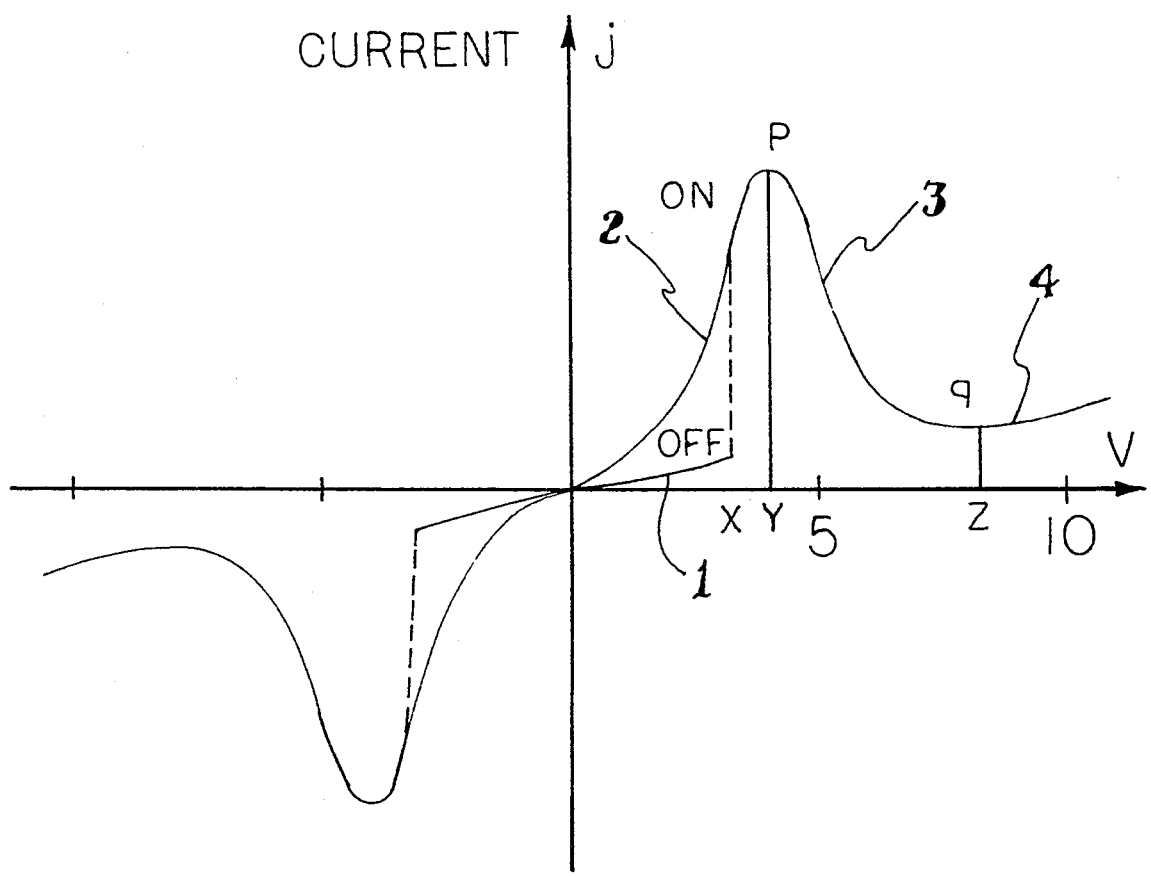
FIG. 2 is a graphical representation of the jV characteristics of a device of this invention illustrating the threshold switching behavior.

This threshold switching behavior is graphically displayed in FIG. 2. Line 1 shows that when the device is in the OFF state, the current density increases only slightly as the applied voltage is increased. When the applied voltage reaches the threshold voltage, x, the device rapidly switches from the OFF state to the ON state wherein the current density is suddenly increased by 2 or three orders of magnitude or more (dotted line).

Once in this ON state, the jV tracing follows lines 2, 3 and 4 wherein the current rises steeply with voltage in the first quadrant (line 2)(and, symmetrically to it, in the third quadrant) until it reaches a maximum current, (p), at a voltage (y). Increasing the voltage beyond this value results in a decrease in current density until a minimum (q) is reached at voltage (z), i.e., the device exhibits a voltage controlled negative differential resistance, or NDR (line 3). Typically the values for (y) range between 4–6V and for (z) between 8–10V. At voltages above (z), the jV curve show the high resistivity characteristic of an insulator (line 4).

Especially advantageous in devices of this invention is the fact that the jV curve is wide and "stable" in the NDR region, i.e., no uncontrollable transitions occur as the applied voltage is changed, although the jV curve is noisier in this region than in the low voltage part (line 2). Thus, any point on the jV curve can be isolated and maintained, provided the source impedance of the voltage supply is smaller by magnitude than the negative differential resistance of the device at that point.

The jV curve of the device in its ON state can be completely traced out for both increasing and decreasing voltages, through the maximum, at a sufficiently low rate of change of the applied voltage. In particular, the curve is continuous through the origin which means (i) there is no holding current necessary to maintain the ON state, and (ii) the device has a "memory" of the ON state even when no voltage is applied.

Figure 3:
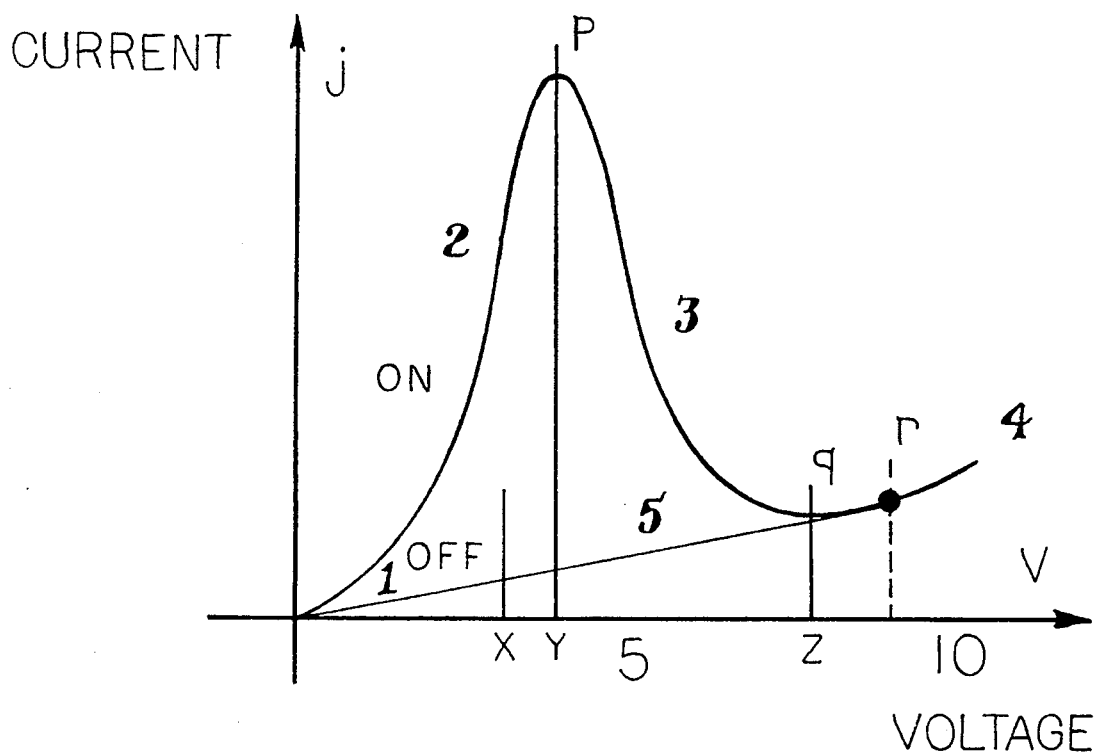
FIG. 3 graphically represents a portion of the jV plot of a device of this invention illustrating the switching off characteristics.

To convert the device from the ON state to the OFF state requires that the applied voltage be removed or reduced to a value around zero at a sufficiently high slew rate from a voltage above (z). As shown in FIG. 3, the jV curve of the device does not go through the current peak (p) when the applied voltage is rapidly lowered in this manner. Rather, it follows a direct, nearly linear path (line 5). Typical slew rates for efficiently switching the device OFF are greater than about 1 V/millisecond with rates greater than about 1 V/microsecond being preferred. It is to be noted that a device in the ON state may be turned OFF by a voltage pulse starting from zero, provided the pulse voltage is larger, or approximately equal to (z) (i.e., the pulse reaches into line 4) and the fall time of the pulse meets the slew rate requirement. Typically, a voltage of 10V for a duration of 1 microsecond or longer is adequate.

When the device is turned OFF in the above manner, it has a high resistance, typically 2 or 3 orders of magnitude higher than in the ON state. The resistance can be determined by measuring the jV curve in the OFF state over a small range of the applied voltage (up to the threshold voltage). The device will remain in the OFF state as long as the applied voltage does not exceed the threshold voltage. Such a device in the OFF state can be converted to the ON state as described above.

Although the mechanism for the effects described above is not fully known, the inventors have shown that the nanostructure of the thin film is essential for switching and negative differential resistance. In particular, the structure of the electronic states associated with the internal surfaces of silicon dioxide derived form hydrogen silsesquioxane are assumed to be responsible for the behavior of the material. The mechanism for switching between the ON and OFF states is proposed to be a solid-state electrochemical redox reaction between the electronic states discussed above.

The effects described above suggest potential applications for these devices as switches, sensors, memory elements, etc.

The following non-limiting Example is provided so that those skilled in the art will understand the invention.

EXAMPLE 1

Figure 4:
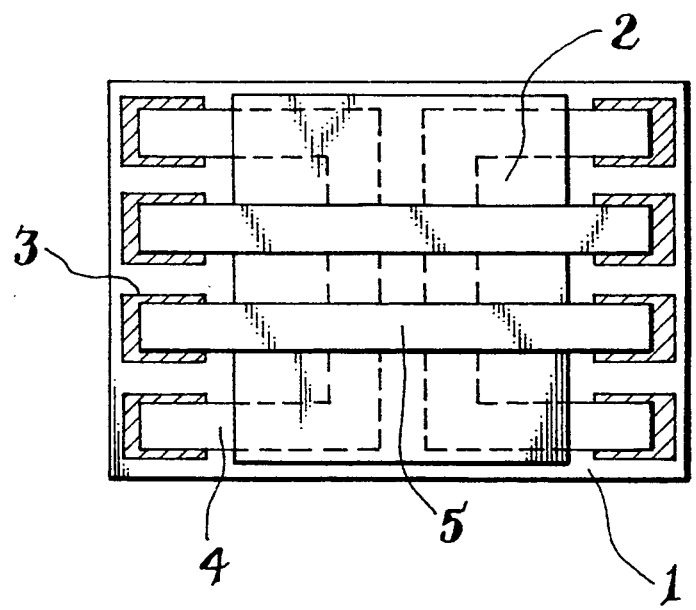
FIG. 4 is a top view of four of the sandwich devices of FIG. 1 as manufactured in Example 1.

FIG. 4 shows the device created by this Example. 8 contact pads (3) were applied to a 1"×1.5" Corning 7059 glass slide (1) by a silk screening process using gold frit paste (conductive coating #8835 by Electroscience Laboratories). The slide with the silk screened contact pads was dried in air at 150° C. and then baked at 520° C. for 30 minutes. Back electrodes (4) were then deposited across the contact pads. These electrodes were deposited by a process which comprised placing the slide in a deposition chamber which was pumped down to 1 mPa using liquid nitrogen in a cold trap, establishing an argon glow discharge between 1.5 and 3 kilovolts therein at a suitable pressure for 10 minutes, and evaporating a 3 nm thick layer of chromium and a 180 nm thick layer of gold through a stainless steel mask.

The contact pads on the slide were masked and a 135 nm thick silicon dioxide thin film (2) was then applied to the surface of the slide. The thin film was applied by diluting hydrogen silsesquioxane resin (prepared by the method of Bank et al. in U.S. Pat. No. 5,010,159) to about 10% in a cyclic dimethylpolysiloxane solvent, coating the surface of the slide with this solution, spinning the slide at 3000 RPM for 10 seconds and pyrolyzing the slide in a furnace in air for 3 hours at 400° C. to form the thin film.

Top electrodes (5) were then deposited on the thin film by the same process as before which comprised placing the slide in a deposition chamber which was pumped down to 1 mPa using liquid nitrogen in a cold trap and then evaporating a 100 nm thick layer of gold through a stainless steel mask. The area of the device was 0.15 cm$^2$.

This device was then mounted in a measurement chamber where the electrodes of one of the four devices were connected to the measuring equipment by applying wires to the contact pads. The chamber was then purged with nitrogen and a variable voltage was applied across the thin film. The voltage V across the device and the current I through the device were measured for each voltage and the current density j was calculated from the device area A.

Figure 5:
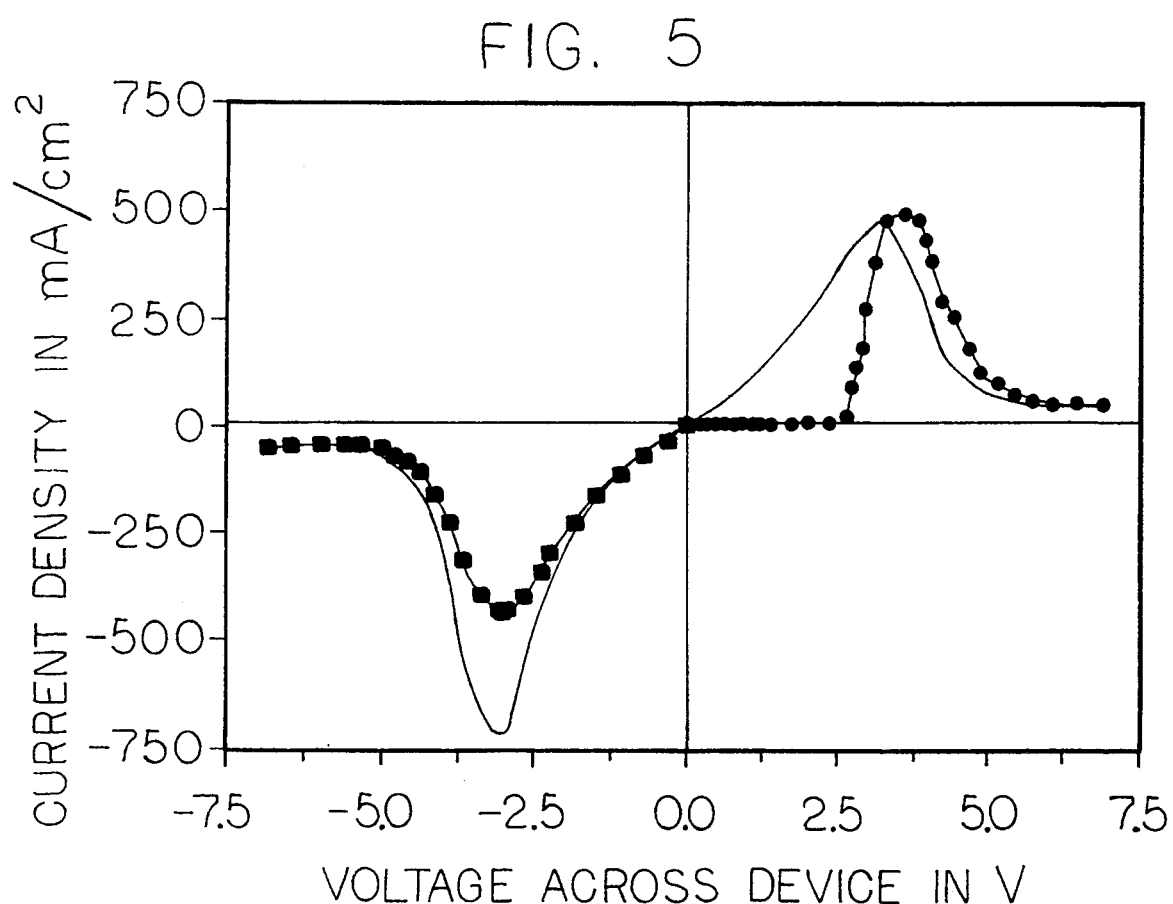
FIG. 5 is a graphical representation of the jV characteristics of the device of FIG. 4 illustrating its threshold switching behavior.

The j-V curve of FIG. 5 was obtained from this device. This curve clearly shows the transition of the device from its OFF state to its ON state as well as a full curve of the device in its ON state.

EXAMPLE 2

A device was created in the same manner as in Example 1 except for the method of film formation. In this Example the thin film was applied by diluting hydrogen silsesquioxane resin (prepared by the method of Bank et al. in U.S. Pat. No. 5,010,159) to about 25% solids in a solvent comprising a mixture of heptane (5% by wt) and dodecane (95% by wt), coating the surface of the slide with this solution, spinning the slide at 3000 RPM for 10 seconds and pyrolyzing the slide in a furnace in air for 3 hours at 400° C. The resultant film was about 450 nm thick. After this film had cooled, a second thin film was deposited on top of the first in the same manner as before. The dual layer film was then approximately 910 nm thick.

Top electrodes were then deposited in the same manner as Example 1. The j-V characteristics were measured and showed nearly the same results as Example 1.

This Example shows that the thin films of this invention are not thickness limited as in the prior art.

EXAMPLE 3

A device was created in the same manner as in Example 1 except for the method of film formation. In this Example a coating solution was formed by mixing 0.462 g Fe(O$_2$C$_5$H$_7$)$_3$, 0.487 g hydrogen silsesquioxane resin (prepared by the method of Bank et al. in U.S. Pat. No. 5,010,159), and 9.9 g 2,4 pentandione. This solution was coated onto the surface of the slide, the slide was spun at 1500 RPM for 15 seconds and the coated slide was pyrolyzed in a furnace in air for 1 hours at 400° C.

Top electrodes were then deposited in the same manner as Example 1. The j-V characteristics were measured and showed nearly the same results as Example 1.

EXAMPLE 4 (comparative)

A device was created in the same manner as in Example 1 except for the method of film formation. In this Example the thin film was formed from Accuglas TM 305 (lot 7794) (an organopolysiloxane) by coating the surface of the slide with this solution, spinning the slide at 3000 RPM for 10 seconds and pyrolyzing the slide in a furnace in air for 1 hour at 400° C. The resultant film was about 200 nm thick.

Figure 6:
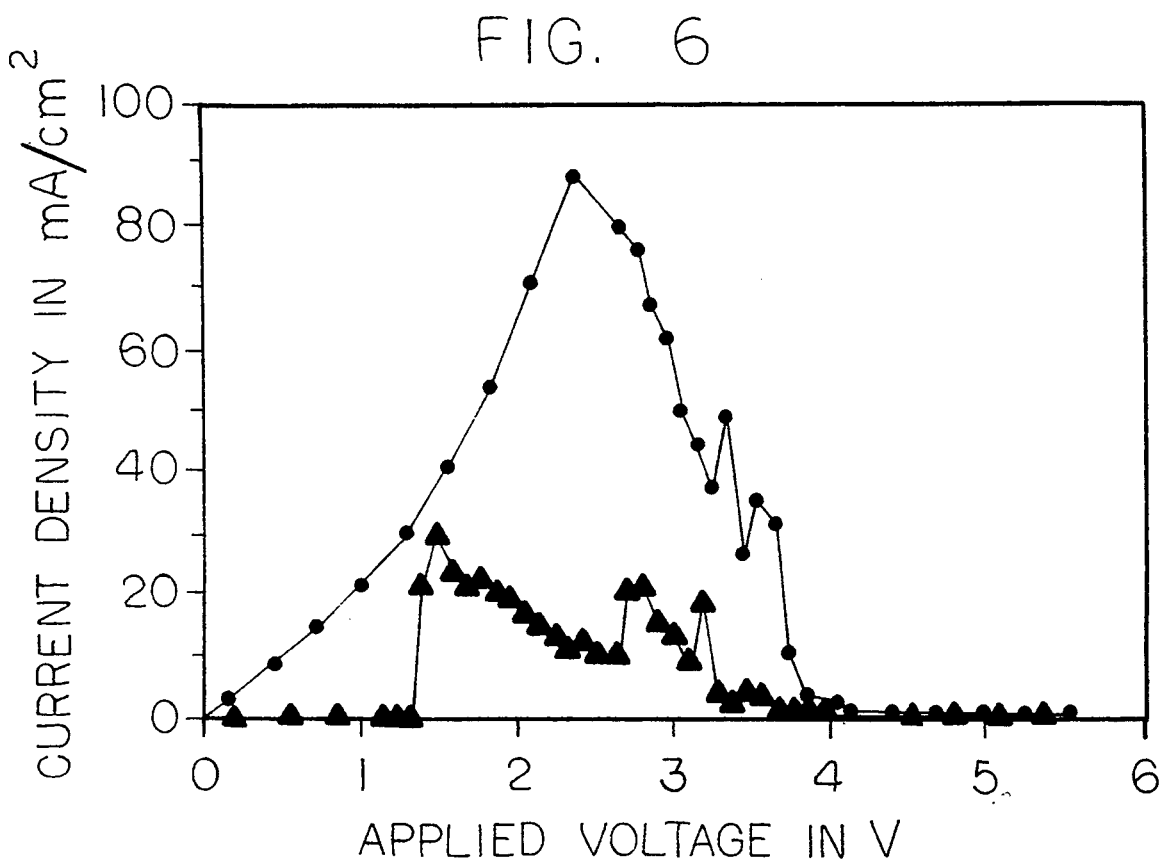
FIG. 6 is a graphical representation of the jV characteristics of a device not in accordance with the present invention wherein the silica is derived from Accuglass TM 305.

Top electrodes were then deposited in the same manner as Example 1. The J-V characteristics were measured and are displayed in FIG. 6. This Figure shows that thin films derived from other silica precursors differ from those derived from H-resin. Specifically, this Figure shows that the threshold voltage for the ON transition is much lower, the NDR regime is wide and noisy, and the JV characteristic is erratic.

EXAMPLE 5 (comparative)

A device was created in the same manner as in Example 1 except for the method of film formation. In this Example the thin film was formed by a vapor deposition process which comprised placing the slide in an electron cyclotron resonance reactor and kept at a substrate temperature of 450° C. A source gas mixture of 25% SiH$_4$ and 75% Ar and O$_2$ for a ratio of O$_2$:SiH$_4$=2.2:1 was admitted into the reactor at a total pressure of 1 Pa and a microwave plasma was maintained in the reactor at a power of 400W for 12 minutes. The resultant film was about 170 nm thick.

Figure 7:
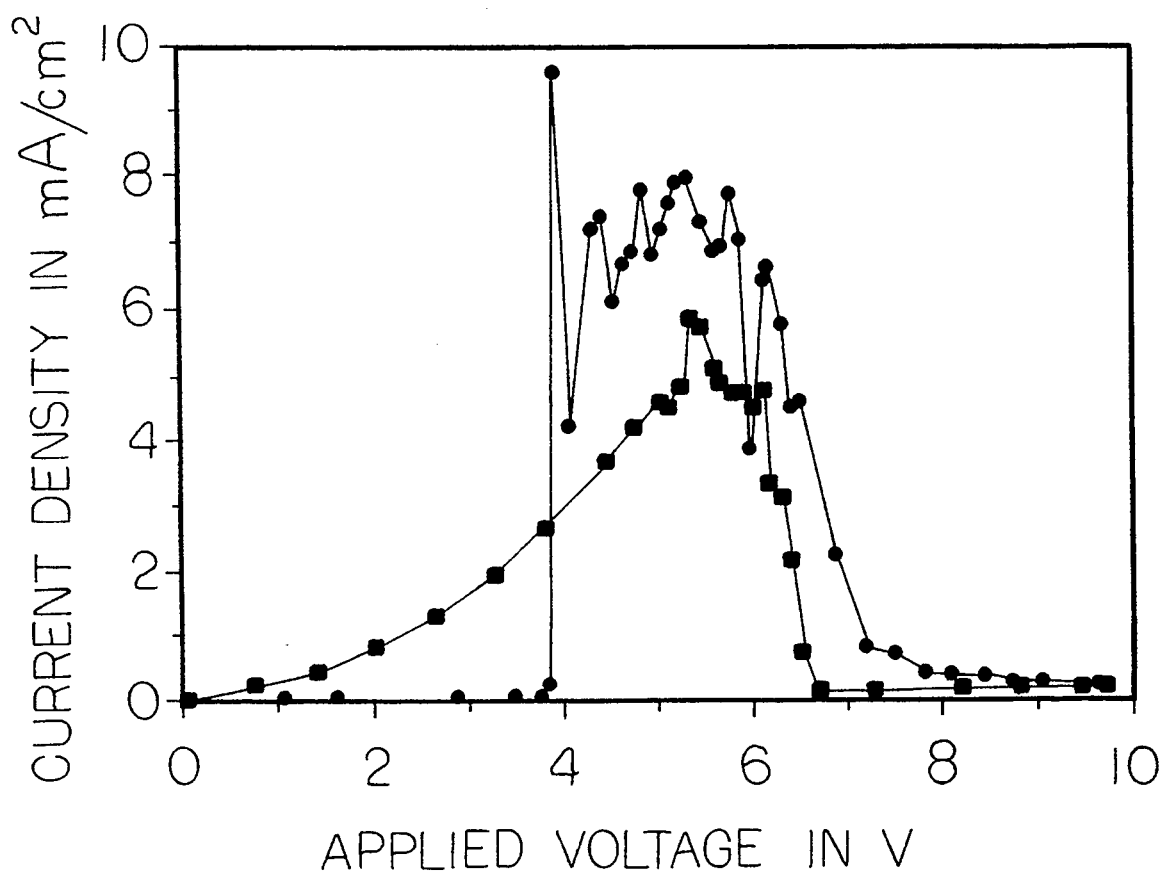
FIG. 7 is another graphical representation of the jV characteristics of a device not in accordance with the present invention wherein the silica is formed by chemical vapor deposition.

Top electrodes were then deposited in the same manner as Example 1. The j-V characteristics were measured and are displayed in FIG. 7. This Figure shows that thin films formed by chemical vapor deposition differ from those derived from H-resin. Specifically, this Figure shows 1) a low ON current and small ON/OFF ratio, 2) higher threshold voltage for ON transition, 3) a very steep NDR regime, and 4) the jV characteristic is erratic.

That which is claimed is:

1. A method of forming a threshold switching device having negative differential resistance comprising
   depositing a film comprising silicon dioxide derived from hydrogen silsesquioxane resin between at least two electrodes and applying a direct current voltage above a threshold voltage for the film across the electrodes, wherein the film has a density between about 0.9 and about 2.1 g/cc.

2. The method of claim 1 wherein the silicon dioxide film is deposited by a process which comprises coating a substrate with a solution comprising a solvent and the hydrogen silsesquioxane resin, evaporating the solvent to form a preceramic coating and then pyrolyzing the preceramic coating.

3. The method of claim 2 wherein the preceramic coating is pyrolyzed at a temperature in the range of from about 100° C. to about 600° C.

4. The method of claim 1 wherein the device is placed in a non-oxidizing atmosphere before applying the voltage above the threshold voltage.

5. The method of claim 1 wherein the electrodes are made of a material selected from the group consisting of gold, aluminum, silver, copper, platinum, gallium arsenide, and silicon.

6. The method of claim 3 wherein the electrodes are made of gold.

7. The method of claim 1 wherein the silicon dioxide film is between about 50 and about 5000 nm thick.

8. The method of claim 9 wherein the silicon dioxide film is between about 100 and about 600 nm thick.

9. The method of claim 2 wherein the solution also contains platinum, rhodium or copper in an amount of about 5 to about 1000 ppm platinum, rhodium or copper based on the weight of hydrogen silsesquioxane resin.

10. A method of forming a threshold switching device having negative differential resistance comprising
    depositing a film comprising silicon dioxide and one or more modifying ceramic oxides between at least two electrodes and applying a direct current voltage above a threshold voltage for the film across the electrodes, wherein the silicon oxide and a modifying ceramic oxide film is derived from hydrogen silsesquioxane resin and a modifying ceramic oxide precursor and wherein the film has a density between about 40 and about 95% of its theoretical density.

11. The method of claim 10 wherein the film is deposited by a process which comprises coating a substrate with a solution comprising a solvent, the hydrogen silsesquioxane resin and the modifying ceramic oxide precursor, evaporating the solvent to form a preceramic coating and then pyrolyzing the preceramic coating.

12. The method of claim 11 wherein the modifying ceramic oxide precursor comprises a compound containing one or more elements selected from the group consisting of iron, titanium, zirconium, aluminum, tantalum, vanadium, and niobium, wherein the compound contains at least one hydrolyzable substituent selected from the group consisting of alkoxy or acyloxy and the compound is present in an amount such that the film contains 0.1 to 30 percent by weight modifying ceramic oxide.

13. The method of claim 12 wherein the preceramic coating is pyrolyzed at a temperature in the range of from about 100° to about 600° C.

14. The method of claim 10 wherein the device is placed in a non-oxidizing atmosphere before applying the voltage above the threshold voltage.

15. The method of claim 10 wherein the electrodes are made of a material selected from the group consisting of gold, aluminum, silver, copper, platinum, gallium, arsenide, and silicon.

16. The method of claim 15 wherein the electrodes are made of gold.

17. The method of claim 10 wherein the film is between about 50 and about 5000 nm thick.

18. The method of claim 17 wherein the film is between about 100 and about 600 nm thick.

19. The method of claim 12 wherein the solution also contains platinum, rhodium or copper in an amount of about 5 to about 1000 ppm platinum, rhodium or copper based on the weight of hydrogen silsesquioxane resin.

* * * * *